United States Patent
Rohatschek

(10) Patent No.: US 8,250,414 B2
(45) Date of Patent: Aug. 21, 2012

(54) METHOD FOR DETERMINING AN ASYMMETRICAL SIGNAL LAG OF A SIGNAL PATH INSIDE AN INTEGRATED CIRCUIT

(75) Inventor: Andreas-Juergen Rohatschek, Wernau/Neckar (DE)

(73) Assignee: Robert Bosch GmbH, Stuttgart (DE)

( * ) Notice: Subject to any disclaimer, the term of this patent is extended or adjusted under 35 U.S.C. 154(b) by 650 days.

(21) Appl. No.: 12/305,044

(22) PCT Filed: Feb. 29, 2008

(86) PCT No.: PCT/EP2008/052482
§ 371 (c)(1),
(2), (4) Date: Apr. 30, 2009

(87) PCT Pub. No.: WO2008/107380
PCT Pub. Date: Sep. 12, 2008

(65) Prior Publication Data
US 2010/0023816 A1    Jan. 28, 2010

(30) Foreign Application Priority Data
Mar. 6, 2007  (DE) .................... 10 2007 010 771

(51) Int. Cl.
*G11B 20/00* (2006.01)
(52) U.S. Cl. ........................ 714/700; 713/503
(58) Field of Classification Search ............... 714/700; 713/503
See application file for complete search history.

(56) References Cited

U.S. PATENT DOCUMENTS

| | | | |
|---|---|---|---|
| 6,058,496 A * | 5/2000 | Gillis et al. ................ 714/727 |
| 7,366,940 B2 * | 4/2008 | Chiao et al. ............... 713/401 |
| 7,627,790 B2 * | 12/2009 | Frisch et al. .............. 714/700 |
| 2002/0026610 A1 | 2/2002 | Merritt | |
| 2005/0028050 A1 * | 2/2005 | Ganry ....................... 714/700 |
| 2005/0149778 A1 * | 7/2005 | Tiwari ........................ 714/700 |

FOREIGN PATENT DOCUMENTS
DE    10 2005 060 903    11/2006

OTHER PUBLICATIONS
International Search Report, PCT/EP2008/052482 dated Jun. 24, 2008.

* cited by examiner

*Primary Examiner* — Yolanda L Wilson
(74) *Attorney, Agent, or Firm* — Kenyon & Kenyon LLP

(57) ABSTRACT

A device has at least one integrated signal path having a measurable asymmetrical signal lag and/or jitter, an output signal of the integrated signal path being able to be decoupled in a first measuring operating mode using a controllable integrated multiplexer to measure an asymmetrical signal lag of a measuring path, which includes the integrated signal path and the integrated multiplexer, and a measuring signal being able to be decoupled in a second measuring operating mode using the controllable integrated multiplexer to measure the asymmetrical signal lag of the integrated multiplexer.

20 Claims, 7 Drawing Sheets

METHOD FOR DETERMINING AN ASYMMETRICAL SIGNAL LAG OF A SIGNAL PATH INSIDE AN INTEGRATED CIRCUIT

FIELD OF THE INVENTION

The present invention relates to a method for determining the asymmetrical signal lag of a signal path inside an integrated circuit and in particular to a method for determining the asymmetrical signal lag of a signal path inside a communication control module in a FlexRay bus.

BACKGROUND INFORMATION

In a FlexRay bus, data are transmitted via a plurality of elements, which each have an asymmetrical lag of signal flanks. The elements are, for example, active stars, transceivers, input buffers, and output buffers.

The asymmetrical signal lag of an element is the difference between the cycle lag of a rising signal flank and the cycle lag of a falling signal flank through the element. The causes of the asymmetrical lag may be divided into systematic and nonsystematic parts. The systematic causes for an asymmetrical lag of a component are permanently predefined for the component within specified tolerance limits at a predefined operating point, for example a specific temperature or a specific supply voltage. A maximum permissible asymmetrical signal lag is fixed by the particular data transmission protocol for a data transmission. A data transmission protocol specifies, for example, that a nominal bit duration is sampled n times and the sampled value is accepted for further data processing at a predefined sampling count. The data processing includes the decoding of a serial data stream, for example. In the data transmission protocol of the FlexRay bus, for example, the nominal bit duration is sampled eight times and the sampled logical value is accepted at a sampling count of five. For the FlexRay data transmission protocol, a maximum of 37.5 ns asymmetrical lag is allowed in the transmission channel for error-free decoding. If the maximum permissible asymmetrical lag is exceeded, an incorrect bit value may be sampled. The flawed bit value is recognized, for example, via a cyclic redundancy check (CRC) and the received data are either discarded or transmitted again with additional effort in the software.

In the design of a bus system, all components causing an asymmetry in the functional chain starting from a transmitting component up to a receiving component must be taken into consideration. For this purpose, the individual asymmetry contributions are typically taken from data sheets and estimations and added up.

In integrated circuits, however, it is not possible to determine the asymmetrical lags caused by an integrated signal path, because no measuring signal may be tapped at a measuring point. An additional test signal pad for tapping a measuring signal of this type represents an unjustifiable additional technical outlay. In addition, the signal pads provided in the housing of the integrated circuit are already occupied in most cases.

SUMMARY

Example embodiments of the present invention provide a method for determining asymmetrical signal lags of the signal path inside an integrated circuit, in which the asymmetrical signal lag may be determined without providing an additional signal pad.

Example embodiments of the present invention provide a method for determining an asymmetrical signal lag and/or jitter of a signal path within an integrated circuit having the following steps:

decoupling a signal output from the signal path using an integrated multiplexer to measure an asymmetrical signal lag of a measuring path, which is formed by the integrated signal path and by the integrated multiplexer;

measuring the asymmetrical signal lag of the integrated multiplexer; and calculating a difference between the asymmetrical signal lag of the measuring path and the asymmetrical signal lag of the integrated multiplexer to determine the asymmetrical signal lag of the signal path.

In an example embodiment of the method according to the present invention, an external measuring device for measuring the asymmetrical signal lag first applies a rising signal flank and subsequently a falling signal flank, the external test device detecting the particular cycle time for the rising signal flank and the cycle time for the falling signal flank, the asymmetrical signal lag being calculated as the difference between the cycle time for the rising signal flank and the cycle time for the falling signal flank.

In an example embodiment of the method according to the present invention, the multiplexer is switched between a first measuring operating mode for measuring the signal lag of the measuring path and a second measuring operating mode for measuring the signal lag of the multiplexer.

In an example embodiment of the method according to the present invention, in a normal operating mode, the multiplexer transmits an output signal output by an integrated logic circuit.

In an example embodiment of the method according to the present invention, the integrated signal path is formed by a data signal path, which outputs a signal to an integrated flank-triggered flip-flop in a normal operating mode.

In an example embodiment of the method according to the present invention, the integrated signal path is formed by a clock signal path, which outputs a clock signal to a clock signal input of an integrated flank-controlled flip-flop in the normal operating mode.

In an example embodiment of the method according to the present invention, an operating mode control unit switches the multiplexer over between the first measuring operating mode, the second measuring operating mode, and the normal operating mode.

In an example embodiment of the method according to the present invention, the flank-triggered flip-flop is formed by a D-flip-flop, which outputs a logical output signal to an integrated decoder of the one integrated circuit.

Example embodiments of the present invention also provide an integrated circuit, which has at least one integrated signal path having measurable asymmetrical signal lag, an output signal of the integrated signal path being able to be decoupled in a first measuring operating mode using a controllable integrated multiplexer to measure an asymmetrical signal lag of a measuring path, which includes the integrated signal path and the integrated multiplexer, a measuring signal being able to be decoupled in a second operating mode using the controllable integrated multiplexer to measure the asymmetrical signal lag of the integrated multiplexer.

In an example embodiment of the integrated circuit, the signal path has at least one buffer circuit for a received data signal.

In an example embodiment of the integrated circuit, the signal path is connected on the output side to a data input of a flank-triggered flip-flop, whose output is connected to an integrated decoder of the integrated circuit.

In an example embodiment of the integrated circuit, the signal path is formed by an integrated clock signal path.

In an example embodiment of the integrated circuit, the clock signal path has an integrated clock generator for generating a clock signal.

In an example embodiment of the integrated circuit, the clock signal generator is a PLL circuit.

In an example embodiment of the integrated circuit, the integrated multiplexer has at least three inputs, one output, and one control input.

In an example embodiment of the integrated circuit, the multiplexer transmits an output of the integrated signal path connected to the first input of the multiplexer in the first measuring operating mode, the multiplexer transmits a clock signal applied to the second input of the multiplexer in the second measuring operating mode, and the multiplexer transmits a logical output signal of an integrated logic circuit applied to a third input of the multiplexer to an output signal pad of the integrated circuit in a normal operating mode.

In an example embodiment of the integrated circuit, the control input of the integrated multiplexer is connected to an integrated operating mode control unit.

In an example embodiment of the integrated circuit, the integrated circuit is a communication controller for a FlexRay bus.

Example embodiments of the method according to the present invention for determining an asymmetrical signal lag of a signal path inside an integrated circuit are described hereafter with reference to the appended figures.

DETAILED DESCRIPTION

Figure 1:
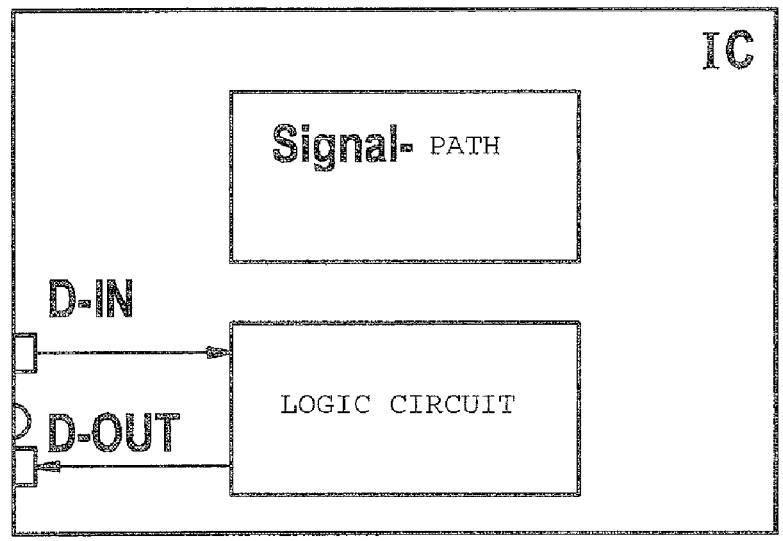
FIG. 1 shows a block diagram of a typical integrated circuit according to the related art.

FIG. 1 shows an integrated circuit according to the related art, which has an arbitrary integrated signal path, such as a data signal path or a clock signal path, and an integrated logic circuit. The logic circuit receives a logical data input signal, which is processed by the logic circuit, via at least one data signal input pin or one data signal input path (D-IN). The logic circuit outputs a corresponding logical data output signal via a data signal output pad (D-OUT).

Figure 2:
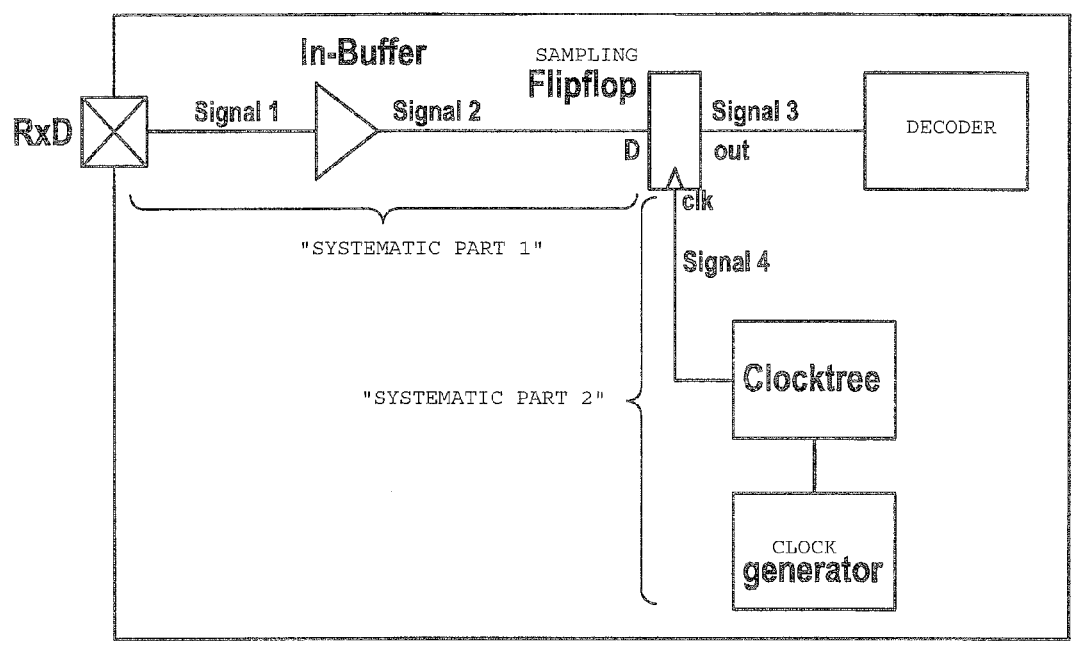
FIG. 2 shows a block diagram of a typical communication module according to the related art.

FIG. 2 shows an example of an integrated circuit of this type according to the related art. The typical integrated circuit shown in FIG. 2 is a communication control module, for example for a FlexRay bus. A data signal is received at an input signal pin or an input signal path RxD and applied via an input signal data buffer to data input D of a sampling flip-flop, such as the data input of a D-flip-flop. The flank-triggered sampling flip-flop receives a clock signal from a clock signal path, which contains a clock signal generator, such as a PLL circuit, which generates a clock signal, via a clock signal input. Generated clock signal CLK is distributed in a tree via clock signal lines of the integrated circuit, for example, and arrives at the clock input of the sampling flip-flop. The sampling flip-flop samples the received data signal and outputs a sampled logical data signal to a downstream decoder. The clock supply of the sampling flip-flop by the clock signal path occurs with a certain inaccuracy, in particular because of the phase jitter of clock signal CLK generated by the PLL circuit. In addition, there is an asymmetrical lag which is caused by tree-shaped branching of the clock signal lines or the clock tree. This asymmetry results in a deviation from ideal clock signal CLK, i.e., in a so-called clock skew. If the communication control module according to FIG. 2 is an integrated circuit, only signal input pin RxD is externally accessible. The clock supply and further elements of the communication module which cause asymmetry are also encapsulated. The typical integrated communication control module according to FIG. 2 thus does not allow any direct measuring access, for example, after the input signal buffer, to determine the asymmetrical signal lag caused by the input signal buffer.

Figure 3:
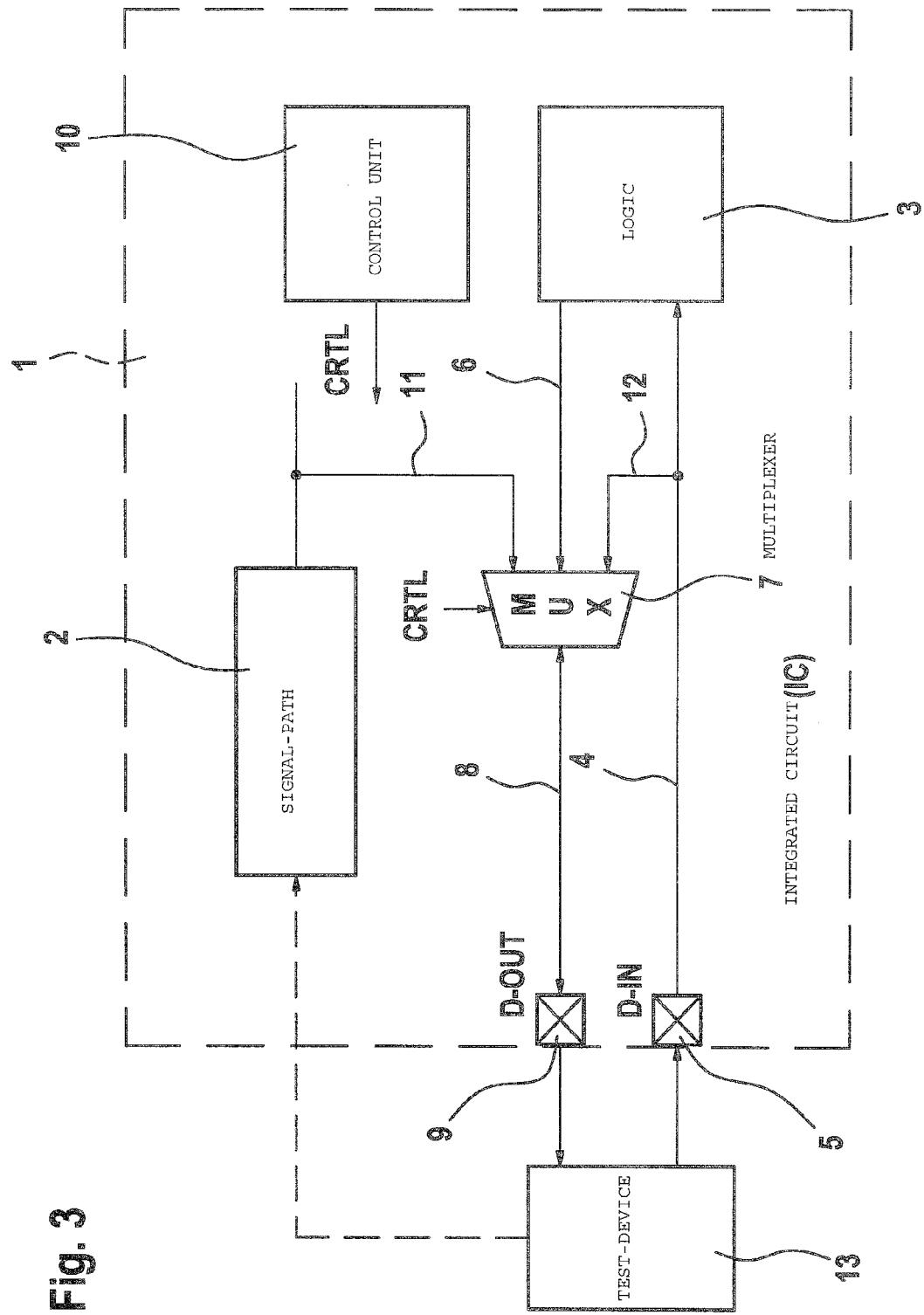
FIG. 3 shows a block diagram of a test configuration for determining an asymmetrical signal lag of a signal path inside an integrated circuit according to an example embodiment according to the present invention.

FIG. 3 shows a block diagram of an integrated circuit 1 according to example embodiments of the present invention. Integrated circuit 1 has an integrated signal path 2 having a measurable asymmetrical signal lag. Signal path 2 is, for example, a data signal path or a clock signal path. Integrated circuit 1 contains a logic circuit 3 in addition to signal path 2. Logic circuit 3 has at least one data input, which is connected via an internal data line 4 to a data input signal pad 5 of integrated circuit 1. The data signal applied to data signal input pad 5 is processed by integrated logic circuit 3. The output signal generated by logic circuit 3 is output via an internal data line 6 to an input of an integrated multiplexer 7. In a preferred specific embodiment of integrated circuit 1, integrated multiplexer 7 has three signal inputs, a control input, and an output, which is connected via an internal data line 8 to a data output signal pad 9 of integrated circuit 1 as shown in FIG. 3. Control signal CTRL to activate multiplexer 7 is generated by an integrated operating mode control unit 10 of integrated circuit 1.

Multiplexer 7 may be switched between its three signal inputs. In a first measuring operating mode MBI of integrated circuit 1, a signal output of signal path 2 is transmitted via an internal line 11 and a first signal input of multiplexer 7 to data signal output pad 9 of integrated circuit 1. In a second measuring operating mode MBII, a measuring signal applied to data signal input 5 is transmitted via an internal data line 12 and a second signal input of multiplexer 7 to data signal output pad 9 of integrated circuit 1. In a normal operating mode NB of integrated circuit 1, the logical output signal output by logic circuit 3 is transmitted via the third input of multiplexer 7 to data signal output pad 9 of integrated circuit 1.

Figure 4:
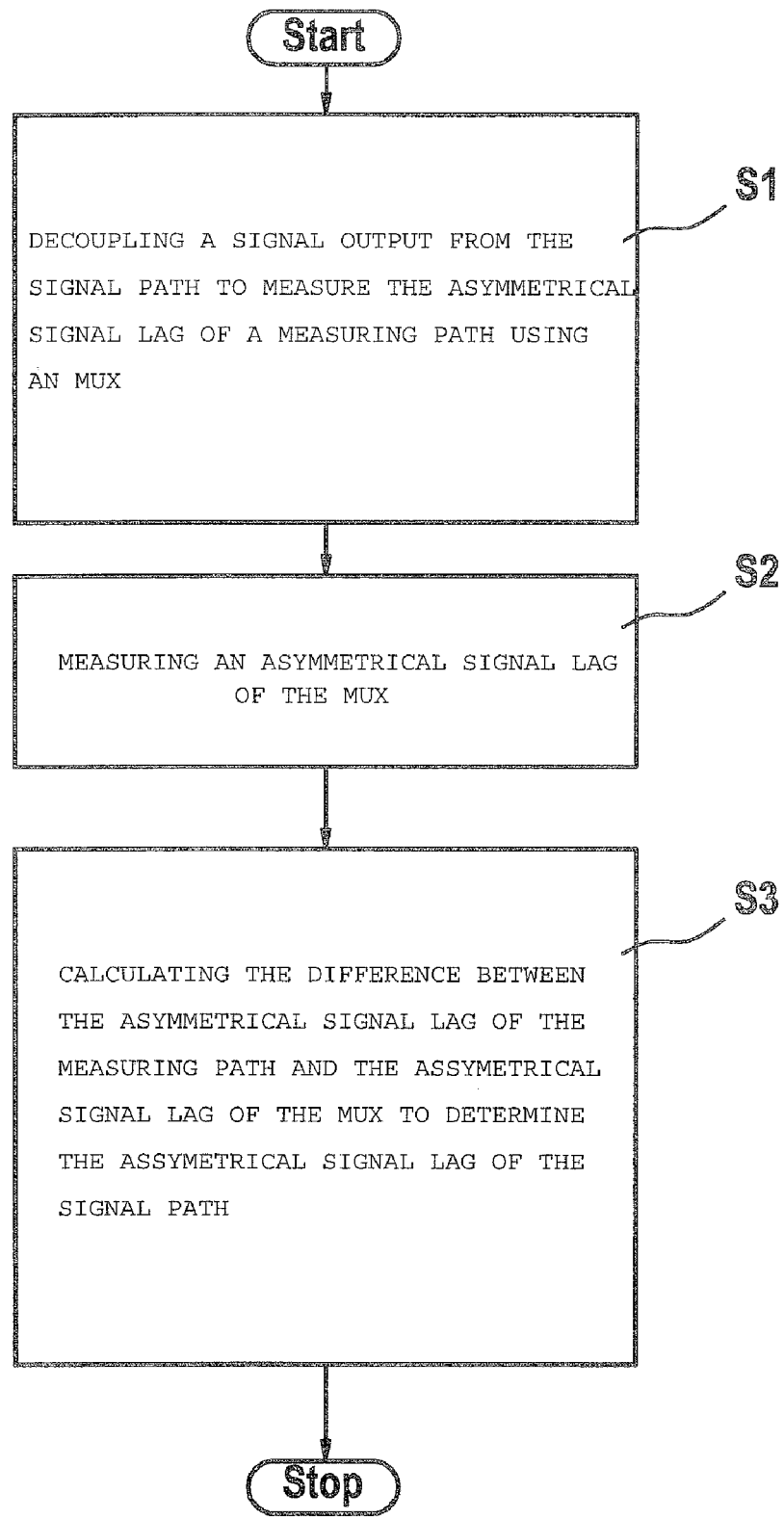
FIG. 4 shows a flow chart of an example embodiment of the method according to the present invention for determining an asymmetrical signal lag of a signal path inside an integrated circuit.

FIG. 4 shows a flow chart illustrating a method according to example embodiments of the present invention for determining an asymmetrical signal lag of internal signal path 2 of integrated circuit 1 shown in FIG. 3. In a first step S1, control unit 10 transmits the output of integrated signal path 2 to data signal output pad 9 by activating multiplexer 7, i.e., the signal output by signal path 2 is decoupled using integrated multiplexer 7 to measure an asymmetrical signal lag of a measuring path. The measuring path is formed by integrated signal path 2, internal line 11, multiplexer 7, and internal line 8. The measuring path contains both integrated signal path 2 and also integrated multiplexer 7. Signal path 2 is, for example, a data signal path or an internal clock signal path. If the signal path is a data signal path, for example, an external test device 13 first applies a rising signal flank and then a falling signal flank to an input of integrated data signal path 2 of integrated circuit 1. External test device 13 measures a signal lag which is caused by the measuring path, i.e., by signal path 2 and multiplexer 7, for both a rising signal flank and also a falling signal flank of the measuring signal. The asymmetrical signal lag of the measuring path, which includes integrated signal path 2 and integrated multiplexer 7, is ascertained or calculated by test device 3 as the difference between the measured cycle time for the rising signal flank and the measured cycle time for the falling signal flank.

In an example embodiment of integrated circuit 1, if signal path 2 is an internal clock signal path, no measuring signal is applied by external test device 13 to signal path 2, because signal path 2 generates a clock signal CLK itself. In both cases, the signal output by signal path 2, i.e., by the data signal path or the clock signal path, is first decoupled by multiplexer 7, to measure the asymmetrical signal lag of the measuring path via data signal output pad 9, to external test device 13, which ascertains the asymmetrical signal lag of the measuring path.

Multiplexer 7 itself has an asymmetrical signal lag as an integrated element. Because it is not known whether the asymmetry of the multiplexer partially compensates for or increases the asymmetry of signal path 2, the asymmetrical signal lag of multiplexer 7 is measured in a further step S2 in the method according to example embodiments of the present invention. For this purpose, control unit 10 transmits the measuring signal applied to data signal input pad 5 to data signal output pad 9 for analysis by testing device 13 by appropriate activation of multiplexer 7.

In a further step S3, testing device 13 calculates the difference between the asymmetrical signal lag of the measuring path and the asymmetrical signal lag of integrated multiplexer 7. The calculated difference corresponds to the asymmetrical signal lag of integrated signal path 2.

To allow the ascertained asymmetry of multiplexer 7 to be subtracted in the second measuring procedure from the asymmetry of the measuring path ascertained in the first measuring procedure and including signal path 2 and multiplexer 7, it is necessary for the asymmetry of multiplexer 7 to be of equal value for both measuring procedures. To achieve this, multiplexer 7 is dimensioned symmetrically with respect to circuitry and layout in a preferred specific embodiment of the integrated circuit according to the present invention. Multiplexer 7 is preferably designed as small as possible in its lateral extension in relation to the chip layout, so that multiplexer 7 behaves nearly identically in regard to its asymmetrical lag times for both procedures.

Figure 7A:
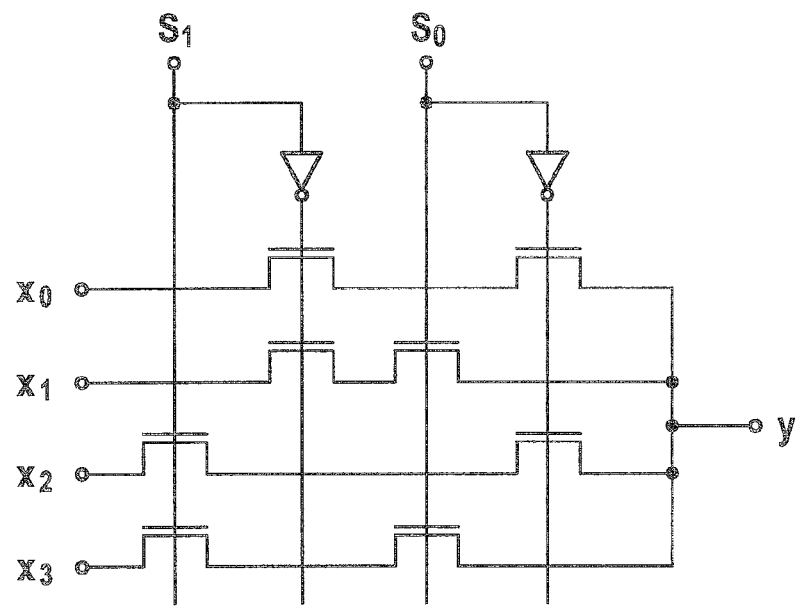
FIGS. 7A, 7B show example embodiments of the multiplexer used in the integrated circuit according to the present invention.
Figure 7B:
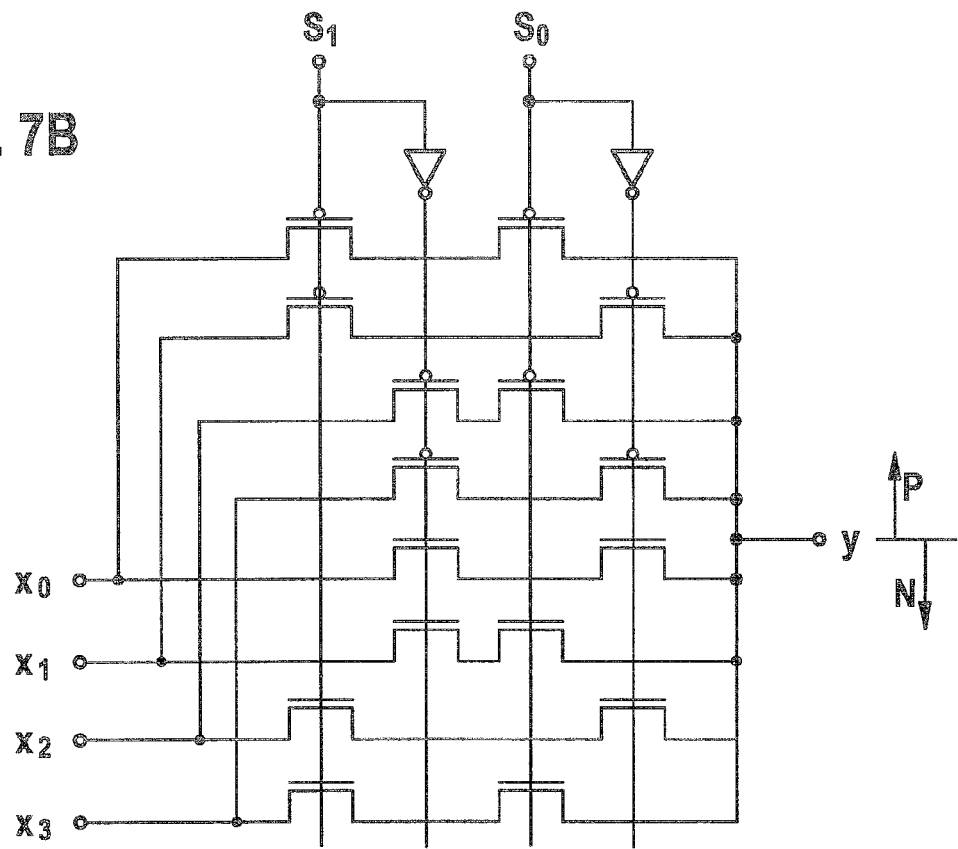

FIGS. 7A, 7B show example embodiments of multiplexer 7. A path from inputs X0, X1, X2, and X3 to output Y is interconnected via control inputs S0 and S1. In the example embodiment shown in FIG. 7A, the multiplexer contains NMOS transistors. The example embodiment shown in FIG. 7B is a CMOS implementation of multiplexer 7.

Figure 5:
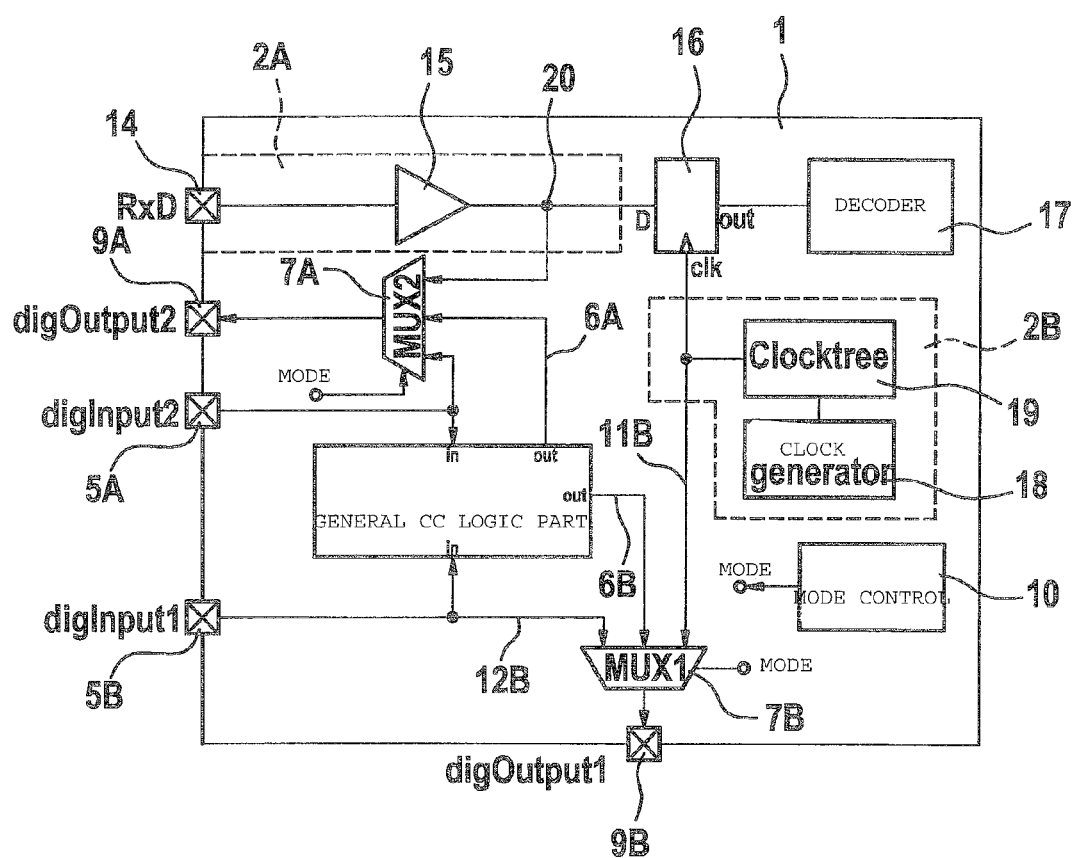
FIG. 5 shows a block diagram of a communication module as an exemplary embodiment of the integrated circuit according to the present invention.

FIG. 5 shows an exemplary embodiment of an integrated circuit 1 according to the present invention. In the exemplary embodiment shown in FIG. 5, integrated circuit 1 is formed by a communication module or by a communication controller for a FlexRay bus. Communication control module 1 according to FIG. 5 has, in addition to an integrated logic circuit 3, two integrated signal paths 2A, 2B, first integrated signal path 2A being formed by an integrated data signal path and second integrated signal path 2B being formed by an internal clock signal path. Each integrated signal path 2A, 2B has an asymmetrical signal lag or a clock jitter, which is measurable in integrated circuit 1 according to example embodiments of the present invention shown in FIG. 5. Each output signal of particular integrated signal path 2A, 2B may be decoupled in a first measuring operating mode MBI using an associated controllable integrated multiplexer 7A, 7B, which is activated by an integrated control unit 10, to measure an asymmetrical signal lag of a measuring path, which is formed by particular integrated signal path 2A, 2B and particular integrated multiplexer 7A, 7B. Communication control module 1 shown in FIG. 5 has a data signal path 2A, which receives a logical data signal to be processed via a received signal pad 14. Data signal path 2A contains at least one serially interconnected buffer 15, which is connected at the output to a data input D of a flank-triggered sampling flip-flop 16. Flank-triggered flip-flop 16 has a clock signal input which is connected to clock signal path 2B of integrated circuit 1. Flank-triggered flip-flop 16 is formed, for example, by a D-flip-flop, whose signal output is provided with an integrated decoder 17 for decoding the data bit stream applied to data signal input pad 14. The clock supply of sampling flip-flop 16 is performed by clock signal path 2B, which contains an integrated clock generator 18, such as a PLL circuit. The clock signal generated by PLL circuit 18 is distributed inside integrated circuit 1 via the clock lines of a clock signal line tree 19 and applied to the clock signal input of sampling flip-flop 16.

To determine the asymmetrical parts of communication control module 1 shown in FIG. 5, both the asymmetrical signal lag of signal path 2A and also the asymmetrical signal lag of signal path 2B are determined. The determination of the two asymmetrical signal lags may be performed concurrently or sequentially by an external test device 13.

External test device 13 first measures the asymmetrical signal lag of signal path 2A by decoupling an applied measuring signal at a tap node 20 and by subsequently measuring the asymmetrical signal lag of integrated multiplexer 7A, in that a measuring signal is applied to data signal input pad 5A and read out via data signal output pad 9A. The asymmetrical signal lag of signal path 2A is then determined by calculating the difference between the measured asymmetrical signal lag of the measuring path, which includes integrated data signal path 2A and integrated multiplexer 7A, and the measured asymmetrical signal lag of integrated multiplexer 7A itself.

The signal lag of clock signal path 2B is determined in the same manner subsequently or in parallel, in that clock signal CLK generated and distributed by clock signal path 2B is decoupled at a tap node 21 before the clock input of sampling flip-flop 16 via multiplexer 7B to data signal output pad 9B of integrated circuit 1. A measurement of the asymmetrical signal lag of integrated multiplexer 7B is again subsequently performed, in that a measuring signal is applied to data signal input pad 5B and read out at data signal output pad 9B.

Figure 6:
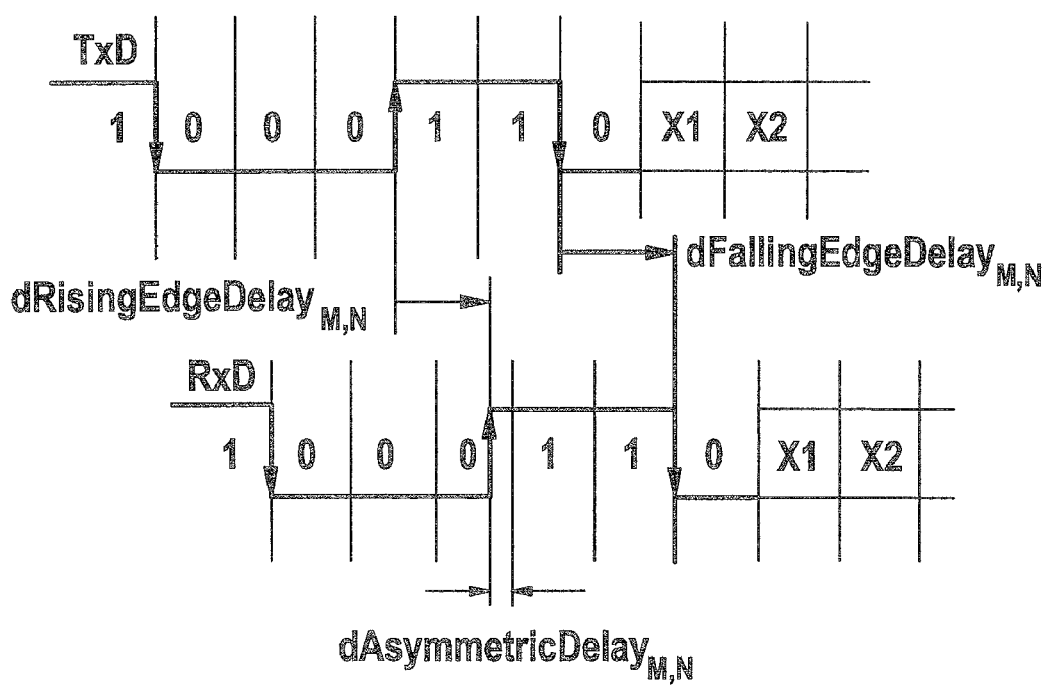
FIG. 6 shows a signal diagram to explain a measuring procedure to determine an asymmetrical signal lag according to the method according to example embodiments of the present invention.

FIG. 6 illustrates the measurement of the asymmetrical signal lag to measure the difference of the cycle time for a falling signal flank and a rising signal flank of a measuring signal.

The asymmetrical lag of the communication module shown in FIG. 5 is primarily composed of two systematic parts. The first systematic part is formed by the asymmetrical lag from input signal pin RxD up to the data input of sampling flip-flop 16.

The second systematic part has the clock signal jitter at the clock signal input of sampling flip-flop 16, i.e., the deviation from the ideal clock in regard to the period duration. The clock signal jitter is composed of the jitter of the clock source, i.e., clock generator 18, such as a quartz or a PLL circuit, as well as asymmetrical lags of the clock signal tree. The clock signal tree is formed by a cascaded tree-shaped buffer circuit, which takes the limited driver capability of clock generator 18 into consideration and ensures a compensated clock supply of all flip-flops inside integrated circuit 1.

In integrated circuit 1 according to example embodiments of the present invention, measuring the systematic parts of the asymmetrical signal lag is made possible using multiplexers 7A, 7B via digital input and output signal pins 5A, 5B, 9A, 9B, which are provided in any case, the asymmetrical parts which are caused by multiplexers 7A, 7B themselves being ascertained in an additional measuring step S2 and subsequently calculated out in a step S3. Integrated circuit 1 according to example embodiments of the present invention and the method according to example embodiments of the present invention allow the asymmetrical lag in communication control module 1 according to FIG. 5 to be determined without using additional pads.

To measure the asymmetry, the signals are preferably applied using a defined bit duration and the resulting bit duration is measured. The difference between the applied bit duration and the measured bit duration corresponds to the asymmetrical signal lag. Alternatively, the cycle lag of a rising signal flank and a falling signal flank may be measured and the asymmetrical signal lag may be determined by the difference calculation.

Integrated circuit 1 according to example embodiments of the present invention may be an arbitrary integrated circuit 1, such as a user-specific integrated circuit ASIC or a programmable integrated logic circuit FPGA. Integrated circuit 1 according to example embodiments of the present invention allows ascertainment of the asymmetrical signal lag of the particular signal path using very little additional circuitry outlay, i.e., by providing one additional multiplexer per signal path.

The method according to example embodiments of the present invention for determining the asymmetrical signal lag and the signal path may be performed both in a design phase in the development of integrated chip 1 and in the production of integrated chip 1 for quality control, but also in the running operation of integrated chip 1.

What is claimed is:

1. A method for determining an asymmetrical signal lag of a signal path inside an integrated circuit, comprising:
   (a) decoupling a signal output from the signal path using an integrated multiplexer to measure an asymmetrical signal lag of a measuring path formed by the signal path and by the integrated multiplexer;
   (b) measuring an asymmetrical signal lag of the integrated multiplexer; and
   (c) calculating a difference between the asymmetrical signal lag of the measuring path and the asymmetrical signal lag of the integrated multiplexer to determine the asymmetrical signal lag of the signal path.

2. The method according to claim 1, wherein an external test device first applies a rising signal flank and then a falling signal flank to measure the asymmetrical signal lag of the measuring path, the external test device detects a cycle time for the rising signal flank and a cycle time for the falling signal flank and calculates the asymmetrical signal lag of the measuring path as a difference between the cycle time for the rising signal flank and the cycle time for the falling signal flank.

3. The method according to claim 1, wherein the integrated multiplexer is switchable between a first measuring operating mode for measuring the asymmetrical signal lag of the measuring path and a second measuring operating mode for measuring the asymmetrical signal lag of the integrated multiplexer.

4. The method according to claim 3, wherein the integrated multiplexer transmits a logical output signal generated by an integrated logic circuit in a normal operating mode.

5. The method according to claim 4, wherein the signal path is formed by a data signal path, which outputs a signal to an integrated flank-triggered flip-flop in the normal operating mode.

6. The method according to claim 5, wherein the signal path is formed by a clock signal path, which outputs a clock signal to a clock input of the integrated flank-triggered flip-flop in the normal operating mode.

7. The method according to claim 4, wherein an operating mode control unit switches the integrated multiplexer over between the first measuring operating mode, the second measuring operating mode, and the normal operating mode.

8. The method according to claim 6, wherein the flank-triggered flip-flop is formed by a D-flip-flop, which outputs a logical output signal to an integrated decoder of the integrated circuit.

9. The method according to claim 1, wherein the asymmetrical signal lag of each of the recited elements is the difference between a cycle lag of a rising signal flank and a cycle lag of a falling signal flank through the element.

10. A device, comprising:
    at least one integrated signal path having a measurable asymmetrical signal lag, an output signal of the integrated signal path being couplable in a first measuring operating mode using a controllable integrated multiplexer to measure an asymmetrical signal lag of a measuring path, which includes the at least one integrated signal path and the integrated multiplexer, a measuring signal decouplable in a second measuring operating mode using the integrated multiplexer to measure an asymmetrical signal lag of the integrated multiplexer.

11. The device according to claim 10, wherein the at least one integrated signal path has at least one buffer circuit for a received data signal.

12. The device according to claim 11, wherein the at least one integrated signal path is connected on an output side to a data input of a flank-triggered flip-flop having an output connected to an integrated decoder.

13. The device according to claim 10, wherein the at least one integrated signal path is formed by an integrated clock signal path.

14. The device according to claim 13, wherein the clock signal path has an integrated clock generator adapted to generate a clock signal.

15. The device according to claim 14, wherein the clock signal generator is a PLL circuit.

16. The device according to claim 10, wherein the integrated multiplexer has at least three inputs, an output, and a control input.

17. The device according to claim 16, wherein the integrated multiplexer is adapted to transmit an output of the at least one integrated signal path connected to a first input of the integrated multiplexer in the first measuring operating mode, transmit a measuring signal applied to a second input of the integrated multiplexer in the second operating mode, and transmit a logical output signal of an integrated logic circuit applied to a third input of the integrated multiplexer to an output signal pad of the device in a normal operating mode.

18. The device according to claim 16, wherein the control input of the integrated multiplexer is connected to an integrated operating mode control unit.

19. The device according to claim 10, wherein the device is a communication controller for a FlexRay bus.

20. The device according to claim 10, wherein the asymmetrical signal lag of each of the recited elements is the difference between a cycle lag of a rising signal flank and a cycle lag of a falling signal flank through the element.

* * * * *